United States Patent [19]
Kamigaki et al.

[11] 4,013,897
[45] Mar. 22, 1977

[54] INFORMATION SIGNAL TRANSFER METHOD AND A CHARGE TRANSFER

[75] Inventors: Yoshiaki Kamigaki, Kokubunji; Hideo Sunami; Yokichi Itoh, both of Hachioji, all of Japan

[73] Assignee: Hitachi, Ltd., Tokyo, Japan

[22] Filed: Nov. 1, 1974

[21] Appl. No.: 520,095

Related U.S. Application Data

[63] Continuation-in-part of Ser. No. 304,922, Nov. 9, 1972, abandoned.

[30] Foreign Application Priority Data

Nov. 12, 1971  Japan ............................. 46-89938

[52] U.S. Cl. ........................... 307/221 D; 357/24
[51] Int. Cl.² .................. G11C 19/28; H01L 29/78
[58] Field of Search .......... 357/24; 307/221 D, 304

[56] References Cited

UNITED STATES PATENTS

| | | | |
|---|---|---|---|
| 3,660,697 | 5/1972 | Berglund et al. .................... | 357/24 |
| 3,761,744 | 9/1973 | Smith ................................. | 357/24 |
| 3,763,480 | 10/1973 | Weimer .............................. | 357/24 |
| 3,858,232 | 12/1974 | Boyle et al. ........................ | 357/24 |

OTHER PUBLICATIONS

M. F. Tompsett "Charge Transfer Devices" J. Vac. Sci. Technol. vol. 9 (7/72) p. 1166–1181.

*Primary Examiner*—William D. Larkins
*Assistant Examiner*—Gene M. Munson
*Attorney, Agent, or Firm*—Birch, Stewart, Kolasch and Birch

[57] ABSTRACT

A charge transfer device and method are disclosed in which a plurality of signal charges corresponding to one information input signal are injected into a surface region of a semiconductor substrate beneath specific ones of a plurality of transfer gate electrodes corresponding to said signal charges and transferred therethrough by the transfer gate electrodes. Transferred signal charges subsequent to the first signal charge transferred are detected, thereby using residual charges to prevent decrease in the amount of the detected transfer charges and thus allowing the output signal to appear at the output terminal with a minimum of attenuation even if an increased number of transfer gate electrodes are used.

4 Claims, 10 Drawing Figures

INFORMATION SIGNAL TRANSFER METHOD AND A CHARGE TRANSFER

This application is a continuation-in-part of U.S. application Ser. No. 304,922 filed Nov. 9, 1972, now abandoned.

BACKGROUND OF THE INVENTION

1. Field of the Invention

The present invention relates to charge transfer devices, more particularly to information signal transfer methods operable at a high signal transfer efficiency in the transfer of an information signal in terms of a plurality of signal charges. The invention relates further to charge transfer devices having a means for injecting a plurality of signal charges into semiconductor surface regions.

2. Description of the Prior Art

As is well-known, the charge-coupled semiconductor device is structurally simple and easily manufacturable, and is used in many ways, such as for shift registers, image devices and display devices. This type of semiconductor device has the structure of MIS (Metal Insulator Semiconductor) and typically comprises a semiconductor substrate, an insulating layer disposed on one surface of the substrate, a means for introducing electric charge carriers into the semiconductor substrate, electrodes separately disposed on the insulating layer for storing the electric charge carriers introduced into the semiconductor substrate and for transferring the electric charge carriers along the surface of the semiconductor substrate adjacent to the insulating layer, means connected to the electrodes for applying an electric field for transferring the carriers to the semiconductor substrate, and a means for detecting the carriers transferred.

In the semiconductor substrate, the minority carrier is used as the electric charge carrier since the semiconductor is adequate to generate minority carriers. Hence, when the semiconductor substrate is of N-type, holes are used as electric charge carriers; while, when it is P-type, electrons are used.

The charge-coupled semiconductor device operates in the following manner.

A DC voltage is applied to a first one of the electrodes on the insulating layer so that a depletion region is formed in a surface region of the semiconductor substrate adjacent to the insulating layer corresponding to the first electrode. Since this depletion region appears only in the surface region of the semiconductor substrate immediately below the first electrode to which the DC voltage has been applied, a potential well is formed in such surface region.

In this state minority carriers are introduced into the semiconductor substrate when, for example, a forward voltage is applied to a P-N junction in the device, or an avalanche phenomenon is induced into the metal oxide semiconductor structure, or radiant rays or light beams are applied thereto. These minority carriers are then collected in the potential well.

A DC voltage larger than was applied to the first electrode is applied to a second electrode next to the first one, with the result that a second potential well deeper than the first one is formed under the second electrode.

Because the carriers in the shallow potential well shift to the deep potential well, the minority carriers are transferred to the surface portion in the semiconductor substrate immediately below the second electrode. After the minority carriers have been transferred, the DC voltage applied to the first electrode is cut off and the voltage on the second electrode is lowered to the level of the voltage applied to the first electrode. This shows that the minority carriers which have first been collected in the place immediately below the first electrode are transferred to the portion in the semiconductor substrate immediately below the second electrode.

By repeatedly applying DC voltages in the above manner, it becomes possible to transfer the minority carrier from one electrode to another.

Principles and fundamental structure of the charge coupled semiconductor device are described in detail in "Charge Coupled Semiconductor Devices." by W. S. Boyle and G. E. Smith, The Bell System Technical Journal, Vol. 49, No. 4 (April, 1970), pp. 587 – 593.

The minority carrier is transferred by applying a three-phase pulsed DC voltage to a trio of electrodes as described in the above paper; they may also be transferred by applying a two-phase pulsed DC voltage to a pair of electrodes and changing the thickness of the insulating layer under each of the electrodes.

This charge-coupled semiconductor device has drawbacks. For example, not 100% of the minority carriers can be transferred from the portion of the semiconductor substrate immediately below an electrode to the portion under the adjacent electrode. This leads to an increased loss of the minority carrier, or a possibility of causing the information to be detected inaccurately. Furthermore, increasing the number of electrodes used results in a lower transferring efficiency, and there are limitations on the number of electrodes which can be used for transferring a sufficient amount of minority carriers to be detected as an information signal.

SUMMARY OF THE INVENTION

In view of the foregoing, the present invention has for its principal aim the provision of an improved device and method capable of minimizing decrease in the amount of the transfer charge.

Therefore, an object of the present invention is to provide a charge transfer device capable of preventing decrease in the amount of charges for transferring the input signal.

Another object of the invention is to provide a signal transfer method operable with a charge transfer device to provide a high signal transfer efficiency for the purpose of deriving a detectably substantial signal from the charge transferred in the substrate surface region beneath a series of electrodes, and for the purpose of permitting the use of more transfer electrodes. It is also desirable to provide a charge transfer device of a construction having means for realizing said signal transfer method.

With the above and other objects in view, the present invention employs a method for transferring a signal in terms of a plurality of signal charges.

BRIEF DESCRIPTION OF THE DRAWINGS

The additional objects, features and advantages of the present invention will become apparent from the following description when read in conjunction with the accompanying drawings, wherein.

PREFERRED EMBODIMENTS OF THE INVENTION

The present invention is predicated upon discoveries of phenomena involved in the mechanism of charge transfer. The inventors of the present invention have experienced the phenomenon that a plurality of output signal charges appear when an input signal charge is injected as the charge which is transferred in the surface region of the semiconductor substrate beneath the electrodes.

This phenomenon is considered ascribable to the reason that the residual charge left untransferred in the surface region of the semiconductor substrate beneath the electrodes in the process of charge transfer by the transfer pulse comes out as an output since such residual charge is transferred by the subsequent transfer pulse before it disappears from the semiconductor surface.

The inventors simulated this phenomenon using an electronic computer. The simulation agreed fairly well with the experimental results.

Figure 1:
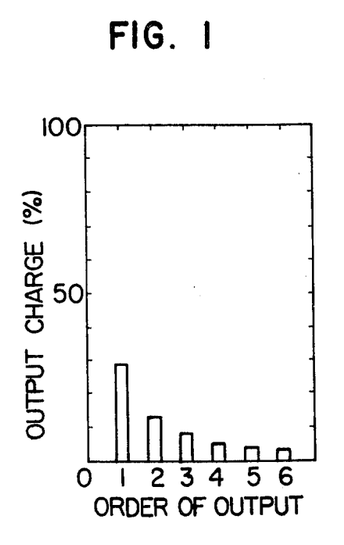
FIGS. 1 through 3 are diagrams showing waveforms of the output charge obtained by simulation.
Figure 2:
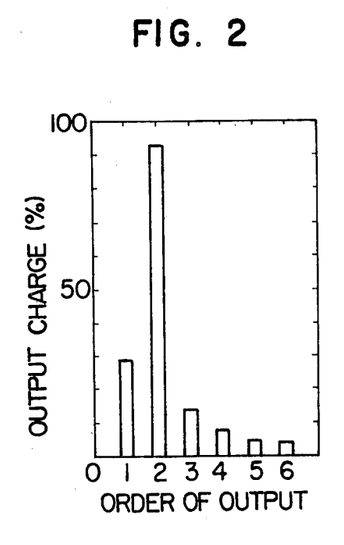
Figure 3:
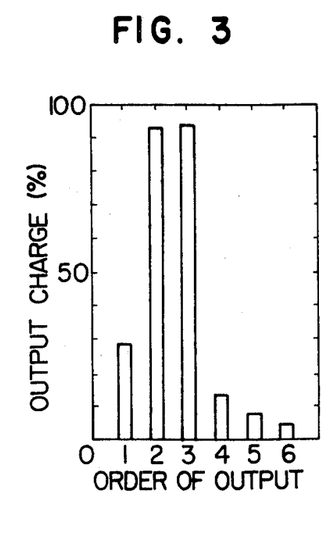
Figure 4:
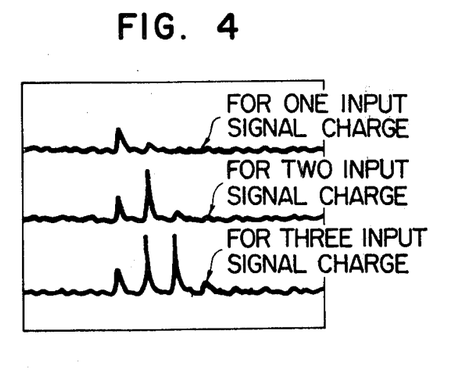
FIG. 4 is a diagram showing waveforms obtained in experiments on an 8-bit charge transfer device.

More specifically, the output signal charges corresponding to one, two and three input signal charges injected into an 8-bit charge transfer device with 24 electrodes were simulated as shown in FIGS. 1 through 3. The result of experiments on the simulated charge transfer device is as shown in FIG. 4.

This simulation was conducted on the assumption that (a) the efficiency of signal transfer by charge transfer is expressed by the charge transfer efficiency, and (b) the amount of injection charge is conserved and the effect due to the growth and recombination of charges is ignored.

A plurality of output signal charges were observed when a single input signal charge was injected. When, for example, a specific number of input signal charges equal in magnitude were injected, certain regularity was observed in the level relation among the output signal charges appearing in the beginning, the number of which is equal to said number of input signal charges. In other words, the amount of the succeeding signal charge is larger than that of the preceding signal charge. The reason why this occurs has been elucidated by simulation. Namely, the succeeding signal charge picks up the charge left behind the preceding signal charge while advancing in the semiconductor surface region beneath the electrodes. Thus the decrease in the amount of the succeeding signal charge is smaller than that of the preceding signal charge.

When one signal is transferred corresponding to a certain specific plural number of input signal charges, the succeeding signal charge is attenuated slower than the preceding signal charge, and the former is less attenuated than the latter. As a result, the succeeding signal charge can be relatively easily detected as an output signal and can reach farther. Because the attenuation in the signal charges transferred in the beginning of the plural input signal charges is the same as that in the signal charge during the transfer of a single input signal, it is effective that one signal is transferred as a certain plural number of signal charges, and a succeeding signal charge after the first is detected.

To obtain a plurality of signal charges corresponding to one signal, it is necessary to provide a process whereby a plurality of signals are formed according to one signal and then are converted into a plurality of signal charges corresponding to the individual signals. In this process the plurality of signal charges can be generated concurrently or sequentially. The concurrently generated plural signal charges are sent into the substrate surface region beneath a plurality of transfer electrodes which correspond to the concurrently generated signal charges, while the sequentially generated plural signal charges are sent sequentially into the substrate surface region beneath some of a plurality of transfer electrodes.

Figure 5:
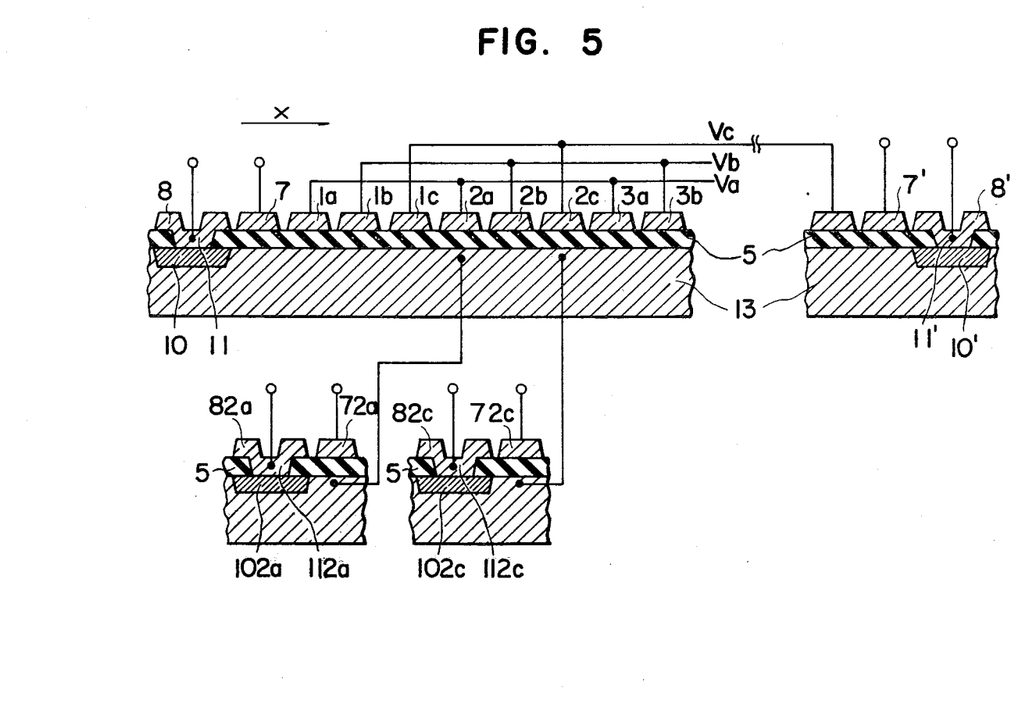
FIGS. 5 and 6 are a sectional view and a plan view illustrating the structure of a signal transfer device embodying the present invention.
Figure 6:
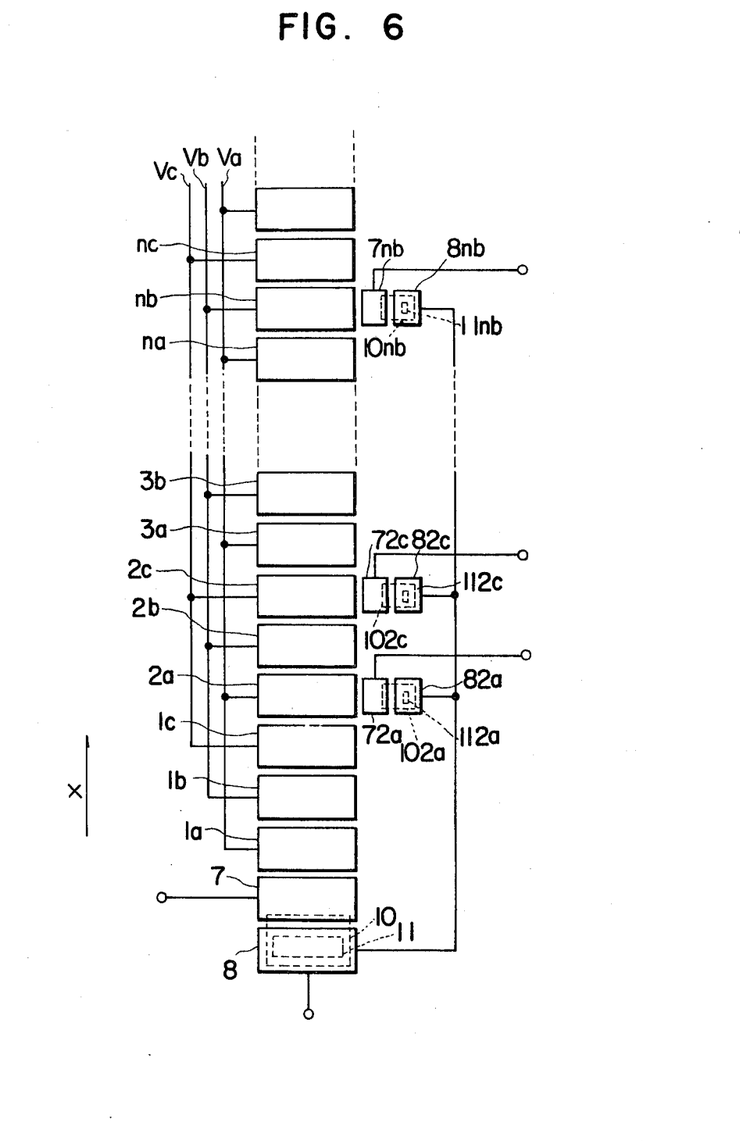
Figure 9:
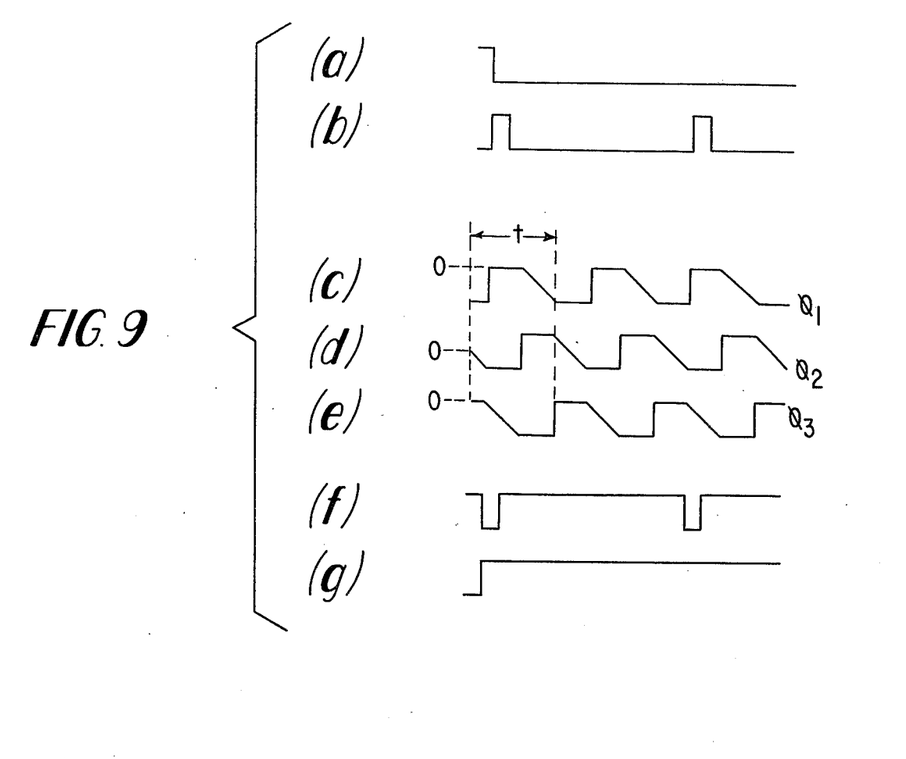
FIG. 9 shows waveforms for use with the charge transfer device.

The signal transfer method of the invention will be described by referring to FIGS. 5 and 6. In this embodiment, the invention is applied to a charge transfer device using three-phase transfer pulses $\phi_1$, $\phi_2$ and $\phi_3$ which have similar waveforms and differ from each other by $t/3$ in one bit period $t$ as shown in FIG. 9. In FIGS. 5 and 6, the charge transfer section comprises a semiconductor substrate 13 (such as N-type silicon substrate) of a first conductivity type having an insulating layer 5, and a plurality of transfer electrodes 1a through 1c, 2a through 2c, . . . disposed in a line on said insulating layer. To these transfer electrodes, three-phase transfer pulses $\phi_1$, $\phi_2$, and $\phi_3$ shown in FIG. 9 are applied respectively, to transfer the charges in the X direction (as indicated by arrow mark). The signal generator section comprises second conductivity type regions (such as P-type regions) 10, 102a, 102c, 10nb formed on the surface region of the substrate 13 by, for example, diffusion techniques, electrodes 8, 82a 82c, 8nb formed on the insulating layer 5, and input gate electrodes 7, 72a, 72c, 7nb disposed in the vicinity of the regions 10, 102a, 102c, and 10nb. The signal generator section further comprises a signal generator element operated so that the carrier (for example, holes) injected from the P-N junction biased forward is controlled by the input gate electrodes 7, 72a, 72c, 7nb and thus a signal is generated in the substrate surface region. At one end of the series of electrodes there is provided a signal receiving section which is symmetrical with the signal generator section components 7, 8, 10 and 11 disposed at the input end of the series of electrodes. The signal receiving section comprises a second conductivity type region 10', a signal pickup electrode 7' formed on the insulating layer 5, an output electrode 8' in ohmic contact with the second conductivity region 10', and a contact hole 11'. The signal charge injected into the second conductivity region 10' is detected at the output electrode 8' by a detector section to be hereinafter described in connection with FIG. 10.

The operation of this device will be described below by referring to FIGS. 5 and 6. The signal charges are stored in the semiconductor surface region beneath the input gate electrodes 7, 72a, 72c, 7nb, from the input electrodes 8, 82a, 82c, 8nb by way of input section diffusion layers 10, 102a, 102c, 10nb through contact holes 11, 112a, 112c, 11nb. When the signal charge below the electrode 7 is being transferred to the region below the transfer electrode 1a adjacent to the electrode 7, the signal charge is being injected into the region below the transfer electrode 2a to which a transfer voltage in phase with the transfer voltage being applied to the adjacent electrode 1a is applied. It is so arranged that the input voltage is applied to the input gate electrodes 7, 72a, 72c, 7nb at different timings. By this arrangement, the signal charge can be injected into the substrate surface region below the electrode 2c or 2nb at the desired timing. Thus, in addition to the signal charge injected into the surface region by the electrode 7, the charges injected from three other places are transferred sequentially from one electrode to another, to reach the output terminal. Hence, by detecting the output signal due to the succeeding signal charges, it becomes possible to obtain the output signal whose charge is not diminished.

Figure 7:
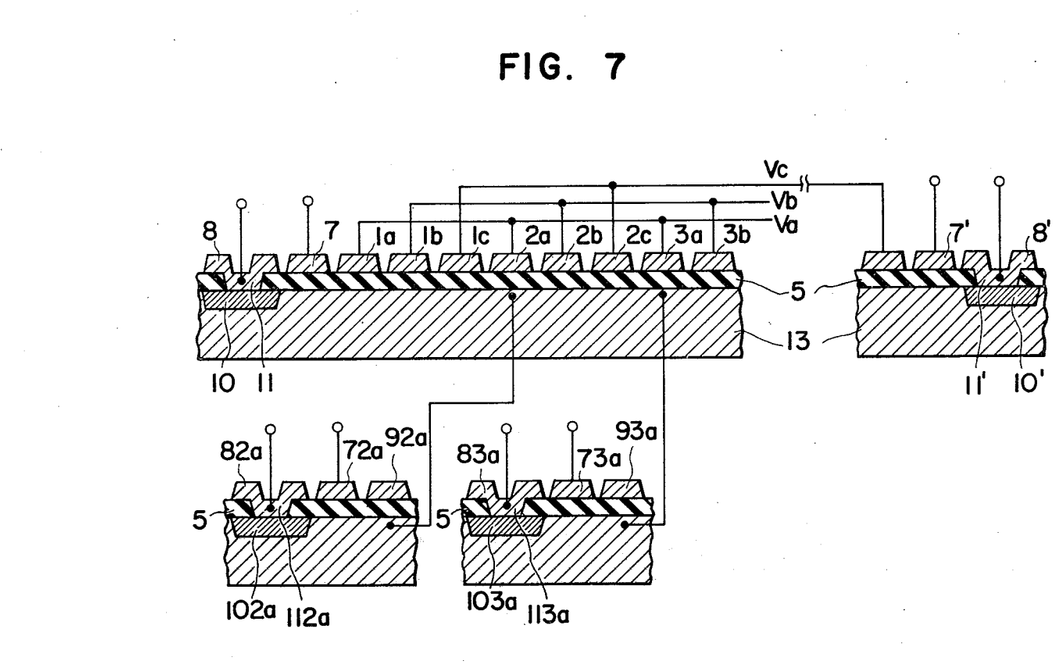
FIGS. 7 and 8 are a section view and a plan view illustrating another embodiment of the invention.
Figure 8:
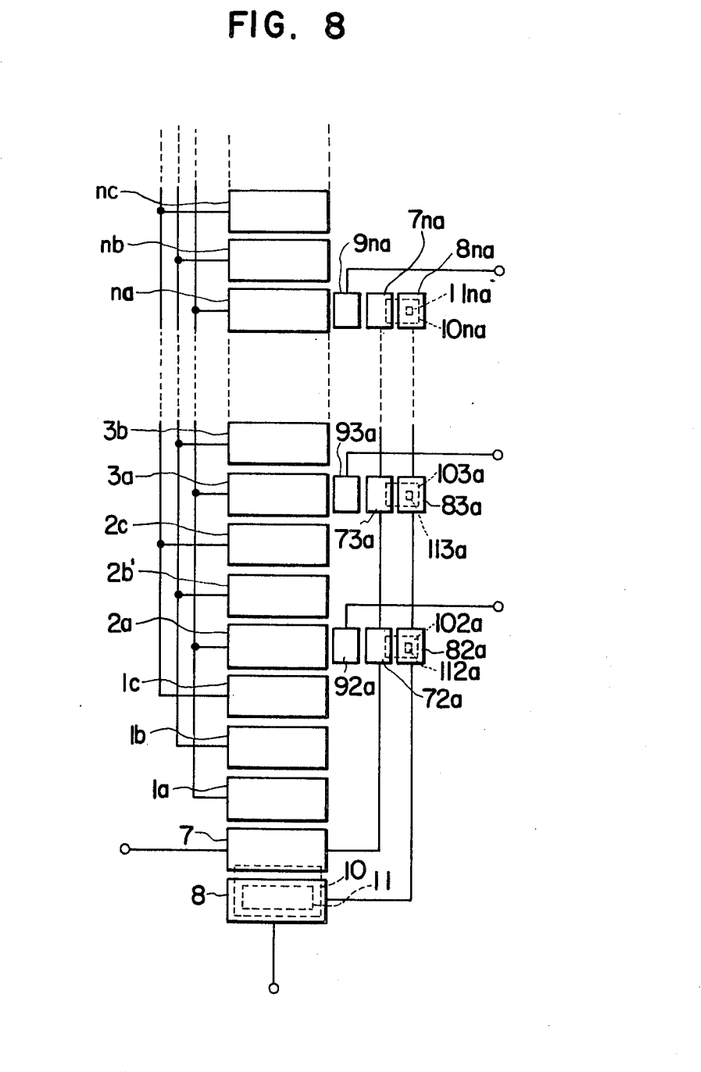

A charge transfer device of the invention having a means for injecting a plurality of signal charges will be described below by referring to FIGS. 7 and 8. The input gate electrodes 72a, 73a, 7na are disposed corresponding to the transfer electrodes 2a, 3a, na to which the same transfer pulses $\phi_1$, $\phi_2$ and $\phi_3$, shown in FIG. 9, are applied. To the input gate electrodes 7, 72a, 72c and 7na, input voltages are applied at the same timing, thereby injecting input signal charges. Input charge control electrodes 92, 93, 9n are disposed on the substrate surface region through an insulating layer, into which surface region the signal charge is injected below the electrodes 2a, 3a, na. Through these control electrodes, the amount of input charge is controlled. By the use of these additional control electrodes, an output signal with three signal charges whose amount has been adjusted can be obtained. In this manner, as in the previous embodiment, a plurality of signal charges corresponding to one input signal can be transferred in sequence to the output terminal, and thus output signals whose charges are less attenuated owing to the succeeding signal charges can be obtained at the output terminal.

As has been described above, the invention makes it possible to prevent decrease in the amount of the transfer charge, to increase the number of transfer electrodes, and control the output signal waveforms.

In the foregoing embodiments, the signal charges are injected from four places. The invention is not limited to this arrangement. Practically the purpose of the invention can be attained with satisfaction by the signal charge injection from two places.

The invention has been described in connection with a basic charge transfer device using three-phase transfer pulses. It is apparent that the invention is applicable to other charge transfer devices using two-phase transfer pulses; for example, one which is described in "Charge-Coupled Digital Circuits," 1971 IEEE ISSCC, Digest of Technical Papers.

Figure 10:
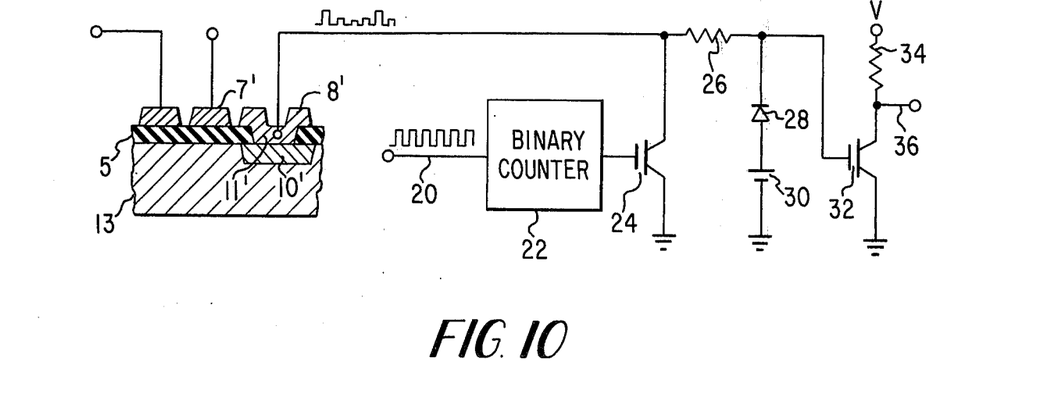
FIG. 10 is a block diagram of a detector employed with the present invention.

Referring now to FIGS. 9 and 10, the method in which the residual charge is employed to counteract the depletion of the information charge carrier during the transfer thereof through the charge transfer device will become readily apparent. The amount of charge introduced into the semiconductor material forming the charge transfer device depends upon the voltage applied to the input electrodes 8, 82a, 82c. Therefore, in digital operation, a signal such as that illustrated at (a) in FIG. 9 is applied to the input electrodes for obtaining a digital 1 information signal, while an input having no voltage value which is applied to the input electrodes provides a digital 0 information signal.

As previously described, the gate electrodes 7, 72a, 72c, 7nb, are utilized for forming channels which act as bridges for charges between the input electrodes and the first potential well formed under an adjacent transfer electrode. The amount of charge introduced into the charge transfer device can be controlled, as is well known in the art, by either changing the voltage value applied to the input electrodes or to the input gate electrodes, and the signal indicated at (b) in FIG. 9 may be applied to the input gate electrode 7, 72a, 72c, and 7nb. Input electrode signals and corresponding gate electrode signals different from those shown in lines (a) and (b) of FIGS. 9 are disclosed in lines (f) (g) respectively.

The transfer gate electrode signals for transferring charges through the charge transfer device in the manner previously described are disclosed in lines (c), (d), and (e) of FIG. 9, where the relationship of the timings between the input pulse voltage, the transferring pulses, and the voltage applied to the input gate electrodes of the charge transfer device may readily be ascertained.

For analog operation, the magnitude of the signal applied to the input electrodes is varied so that pulses of different magnitudes indicative of various analog values are injected and transferred.

Each information signal transferred through the charge transfer device picks up some of the residual signal from a preceding information signal. This is illustrated by FIG. 2 wherein the signal designated 1 is the output resulting from a digital 1 input, the signal designated 2 is the output resulting from a next succeeding digital 1 input, the signal designated 3 is the output resulting from a digital 0 input succeeding the second digital 1 input, and the signals designated 4, 5 and 6 all result from succeeding digital 0 inputs. FIG. 2 provides a very good illustration of the effect that the residual charge has on an information signal which is exactly the same as the next preceding information signal. From a consideration of FIG. 2, it will be readily apparent that it is quite beneficial to operate in accordance with the method of the present invention wherein at least first and second charge carriers in response to the same information signal are transferred through the charge transfer device, and only the output resulting from the second charge carrier is detected. It will also be apparent from FIG. 2 that a charge carrier indicative of a digital 0 input which follows a digital 1 input will pick up some of the residual charge from the preceding digital 1 charge carrier, and thus it is beneficial to permit the residual charge applied to the first digital 0 charge carrier to dissipate before detecting a succeeding output signal resulting from a second digital 0 charge carrier. Obviously, however, with a digital 0 input, there will be some slight output signal in a digital 0 situation due to the residual charge and noise signals. Thus, the detector should operate at a threshold level which eliminates the small signal values present with digital 0 outputs which may be the result of residual charges from previous digital 1 signals.

Although a number of suitable known detectors may be used to accomplish the method of the present invention, a suitable detector system is shown in FIG. 10. In this detector system, an input 20 receives timing pulses which correspond to the timing of the output pulses from the output electrode 8' of the charge transfer device. These timing pulses may be provided from any suitable source, but ideally may be provided by the same source which applies the input pulses to the input gate electrodes of the charge transfer device. The pulses on the input 20 are provided to a binary counter 22 which operates in response to every odd number input signal to complete a circuit through a transistor 24 to ground. The binary counter 22 may be any suitable known binary counter capable of performing this operation, such as for example the SN 7490 binary counter sold by Texas Instruments Inc. Thus, in response to the first, third, fifth, seventh, etc, pulses on the input 20, the binary counter 22 completes the circuit through the transistor 24 to ground. The transistor 24 may be a conventional MOS FET or a similar known transistor switching unit.

The transistor 24 is connected to conduct the output signals from the charge transfer device to ground each time the binary counter 22 causes the transistor to complete a ground circuit, and thus, only each second or succeeding output signal is developed across a resistor 26. In this manner, the method of the present invention is accomplished, for the first output signal is conducted to ground while the next output signal bearing the residual charge from the previous signal is developed across the resistor 26. It now becomes necessary to determine whether this output signal is indicative of a digital 1 input or a digital 0 input, and this is accomplished by the diode 28 and the threshold voltage source 30 which is connected between ground and the gate electrode of an MOS FET transistor detector 32. A first electrode of the transistor detector is connected to a voltage source V by means of a resistor 34 and also to an output terminal 36, while a second electrode is connected to ground. The voltage from the source V developed across the resistor 34 and the threshold voltage from the voltage source 30 are regulated so that when the output signal from the charge transfer device developed across the resistor 26 is of a magnitude which exceeds the magnitude of the threshold voltage, an output signal equal to the voltage across the resistor 34 from the voltage source V appears at the output 36. Conversely, when the signal across the resistor 26 is of smaller magnitude than the threshold voltage from the threshold source 30, then a zero output appears at the output 36. The threshold voltage from the voltage source is of a predetermined magnitude so that output signals from the charge transfer device resulting from digital 0 inputs are still of smaller magnitude than the voltage from the threshold source in spite of the residual charge from a previous information signal.

Obviously, a number of detector circuits other than that disclosed in FIG. 10 could be employed to accomplish the method defined by this invention, and this circuit is merely illustrative of one circuit which may be so utilized.

We claim:

1. In a charge transfer device for the transfer of charge carriers representing signal information along a semiconductor substrate between signal input means for introducing such charge carriers into said substrate and an output means for detecting said charge carriers, including an insulating layer disposed on the surface of the substrate between the signal input means and the output means, charge carrier transfer means for transferring charge carrier introduced into said substrate by said input means, said charge carrier transfer means including a plurality of spaced electrodes disposed on said insulating layer and means connected to the electrodes for providing voltages to the electrodes for transferring charge carriers introduced into the substrate, said semiconductor substrate consisting entirely of semiconductive material of one type of conductivity adjacent said spaced electrodes, the improvement comprising signal means connected to said input means to provide an information signal to said input means, said input means functioning to introduce into said substrate a set of substantially equal first and second signals of charge carriers representing said information signal, said first signal being introduced into said substrate before said second signal, said output means functioning to detect said introduced second signal as information, said input means including at least first and second charge carrier injection electrodes connected to receive the information signal from said signal means, said first and second charge carrier injection electrodes being sequentially mounted in line upon said semiconductor substrate in relative spaced relationship and in spaced relationship to said output, said first charge carrier injection electrode being disposed adjacent one of the electrodes of said charge carrier transfer means and said second charge carrier injection electrode being disposed adjacent one of the other electrodes of said charge carrier transfer means disposed between said one of the electrodes of said charge carrier transfer means and said output means, said signal means being arranged to operate so as to simultaneously provide said signal information to said first and second charge carrier injection electrodes.

2. The charge transfer device of claim 1 wherein charge control electrode means are disposed on said insulating layer between said first charge carrier injection electrode and next succeeding first transfer electrode and between said second charge carrier injection electrode and next succeeding second transfer electrode, said charge control electrode means being operative to control the amount of charge carriers introduced into the substrate by said charge carrier injection electrodes.

3. The charge transfer device of claim 1, wherein said first signal comprises more than two signals of charge carriers.

4. The charge transfer device of claim 1, in which said means connected to the electrodes is arranged to provide voltages of the same polarity and of increasing magnitude for transferring charge carriers introduced into said substrate.

* * * * *